(12) United States Patent
Chiu

(10) Patent No.: US 10,386,895 B2
(45) Date of Patent: Aug. 20, 2019

(54) CHASSIS STRUCTURE

(71) Applicants: LITE-ON ELECTRONICS (GUANGZHOU) LIMITED, Guangzhou (CN); Lite-On Technology Corporation, Taipei (TW)

(72) Inventor: Liang-Cheng Chiu, Taipei (TW)

(73) Assignees: LITE-ON ELECTRONICS (GUANGZHOU) LIMITED, Guangzhou (CN); Lite-On Technology Corporation, Taipei (TW)

( * ) Notice: Subject to any disclaimer, the term of this patent is extended or adjusted under 35 U.S.C. 154(b) by 0 days.

(21) Appl. No.: 15/890,357

(22) Filed: Feb. 7, 2018

(65) Prior Publication Data

US 2018/0232017 A1   Aug. 16, 2018

Related U.S. Application Data

(60) Provisional application No. 62/459,608, filed on Feb. 16, 2017.

(51) Int. Cl.

| G06F 1/18 | (2006.01) |
| H05K 5/00 | (2006.01) |
| H05K 5/02 | (2006.01) |
| F16B 5/06 | (2006.01) |
| F16B 5/00 | (2006.01) |

(52) U.S. Cl.
CPC ........... *G06F 1/181* (2013.01); *H05K 5/0013* (2013.01); *H05K 5/0221* (2013.01); *F16B 5/0016* (2013.01); *F16B 5/0614* (2013.01); *F16B 2005/0678* (2013.01)

(58) Field of Classification Search
CPC ....... G06F 1/181; G06F 1/182; G11B 33/027; F16B 5/0016; F16B 5/0614; F16B 2005/0678; H05K 5/0013; H05K 5/0221; H05K 5/0239; H05K 5/03; Y10S 292/37; Y10T 292/0894; Y10T 292/0895; Y10T 292/09; Y10T 292/0901; Y10T 292/0907
See application file for complete search history.

(56) References Cited

U.S. PATENT DOCUMENTS

| 1,015,907 | A | * | 1/1912 | Ryder | ................ | B64D 37/005 |
| | | | | | | 220/246 |
| 3,893,584 | A | * | 7/1975 | Ledford | ................ | E05C 19/06 |
| | | | | | | 220/323 |
| 4,964,659 | A | * | 10/1990 | Baldwin | ................ | E05C 19/06 |
| | | | | | | 220/235 |
| 6,464,102 | B1 | * | 10/2002 | Harmon | ............... | H05K 5/0221 |
| | | | | | | 220/4.02 |
| 7,061,755 | B2 | * | 6/2006 | Lin | ........................ | G06F 1/181 |
| | | | | | | 361/679.58 |

(Continued)

*Primary Examiner* — Andrew M Roersma
(74) *Attorney, Agent, or Firm* — JCIPRNET

(57) ABSTRACT

A chassis structure includes a box assembly and a cover plate. The box assembly includes a main plate, a plurality of side plates, a base and a pressing element. The base is disposed on one of the plurality of side plates and has a plurality of first locking portions. The pressing element is slidably disposed on the base. The cover plate is assembled on the side plate and has a plurality of second locking portions, wherein the first locking portions are adaptable to be locked with the second locking portions.

17 Claims, 7 Drawing Sheets

(56) References Cited

U.S. PATENT DOCUMENTS

| | | | | |
|---|---|---|---|---|
| 7,158,385 B1* | 1/2007 | Wang | ............... | G06F 1/181 |
| | | | | 361/754 |
| 7,261,383 B2* | 8/2007 | Fan | ............... | G06F 1/181 |
| | | | | 292/303 |
| 7,410,194 B2* | 8/2008 | Chen | ............... | E05C 1/14 |
| | | | | 292/37 |
| 8,205,918 B2* | 6/2012 | Hsu | ............... | H05K 7/1489 |
| | | | | 292/80 |
| 8,297,720 B2* | 10/2012 | Yang | ............... | G06F 1/181 |
| | | | | 312/223.2 |
| 2006/0103272 A1* | 5/2006 | Chen | ............... | E05B 65/006 |
| | | | | 312/223.2 |

* cited by examiner

CHASSIS STRUCTURE

CROSS-REFERENCE TO RELATED APPLICATION

This application claims the priority benefit of U.S. provisional application Ser. No. 62/459,608, filed on Feb. 16, 2017. The entirety of the above-mentioned patent application is hereby incorporated by reference herein and made a part of this specification.

BACKGROUND OF THE INVENTION

Field of the Invention

The invention is related to a chassis structure, and particularly to a chassis structure having a detachable cover plate.

Description of Related Art

Along with advancement of technologies, personal computers are commonly applied in work and life. Currently, common personal computers include desktop computers and notebook computers and so on.

In terms of desktop computers, the chassis of a host includes a box and a cover plate. Generally the cover plate may be detachably assembled on the box for ease of maintenance and change of the element in the chassis. For a typical chassis, the box and the cover plate are combined together by the means of screw-fastening, which makes it difficult to assemble/disassemble. To replace the screw-fastening design, some chassis adopt push bar and locking method for combination. However, in the push bar/locking design, since the pushing direction of push bar is perpendicular to the sliding direction of cover plate, manual operation is required, and such design still causes inconvenience. In view of the above, it is an important issue in the design of chassis to find out how to make the cover plate to be more easily disassembled by single hand.

SUMMARY OF THE INVENTION

The invention provides a chassis structure, and a cover plate thereof can be easily detached by single hand.

In the invention, the chassis structure includes a box assembly and a cover plate. The box assembly includes a main plate, a plurality of side plates, a base and a pressing element. The base is disposed on one of the plurality of side plates and has a plurality of first locking portions. The pressing element is slidably disposed on the base. The cover plate is assembled on the side plate and has a plurality of second locking portions, wherein the first locking portion is adaptable to be locked with the second locking portion.

In an embodiment of the invention, the plurality of first locking portions include protrusions.

In an embodiment of the invention, the protrusion has a guiding slope.

In an embodiment of the invention, the plurality of second locking portions include sheets and the sheet has a locking hole.

In an embodiment of the invention, a terminal end of the sheet includes a stopping portion.

In an embodiment of the invention, the base has a plurality of openings; the plurality of second locking portions partially pass through the plurality of openings to be locked with the plurality of first locking portions respectively.

In an embodiment of the invention, an edge of the cover plate has a folding wall.

In an embodiment of the invention, the folding wall has a notch, and the plurality of second locking portions are connected to an inner edge of the notch.

In an embodiment of the invention, the plurality of first locking portions include elastic sheets.

In an embodiment of the invention, the elastic sheet has an opening. The pressing element includes a pillar, and the pillar corresponds to the opening.

In an embodiment of the invention, a terminal end of the elastic sheet has a bending portion, and the opening is formed on the bending portion.

In an embodiment of the invention, a guiding segment is extended from an inner edge of the opening, and the guiding segment guides the pillar to pass through the opening.

In an embodiment of the invention, the base has a plurality of sliding slots, the pressing element has a plurality of sliding bumps, and the plurality of sliding bumps are disposed in the plurality of sliding slots.

In an embodiment of the invention, the box assembly includes an elastic element, and the elastic element is disposed between the base and the pressing element.

In an embodiment of the invention, the pressing element is completely accommodated in the base.

In summary of the above, in the chassis structure of the invention, the side plate is provided with a base and a pressing element. The base is used to be locked with the cover plate, and the pressing element is used to move relative to the base to change the locking status of the base and the cover plate. The user can release the cover plate from the base by pressing the pressing element with simply one hand, and thus the cover plate can be easily detached.

In order to make the aforementioned features and advantages of the disclosure more comprehensible, embodiments accompanying figures are described in detail below.

DESCRIPTION OF EMBODIMENTS

Figure 1:
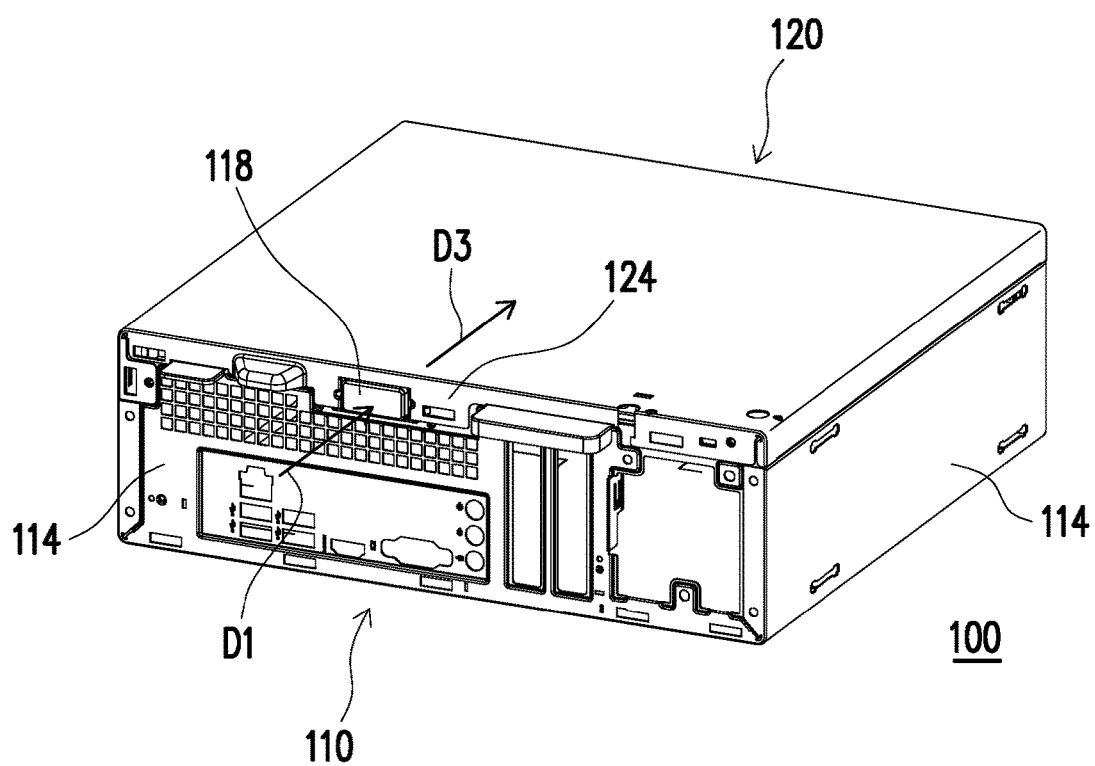
FIG. 1 is a perspective view illustrating a chassis structure according to an embodiment of the invention.
Figure 2:
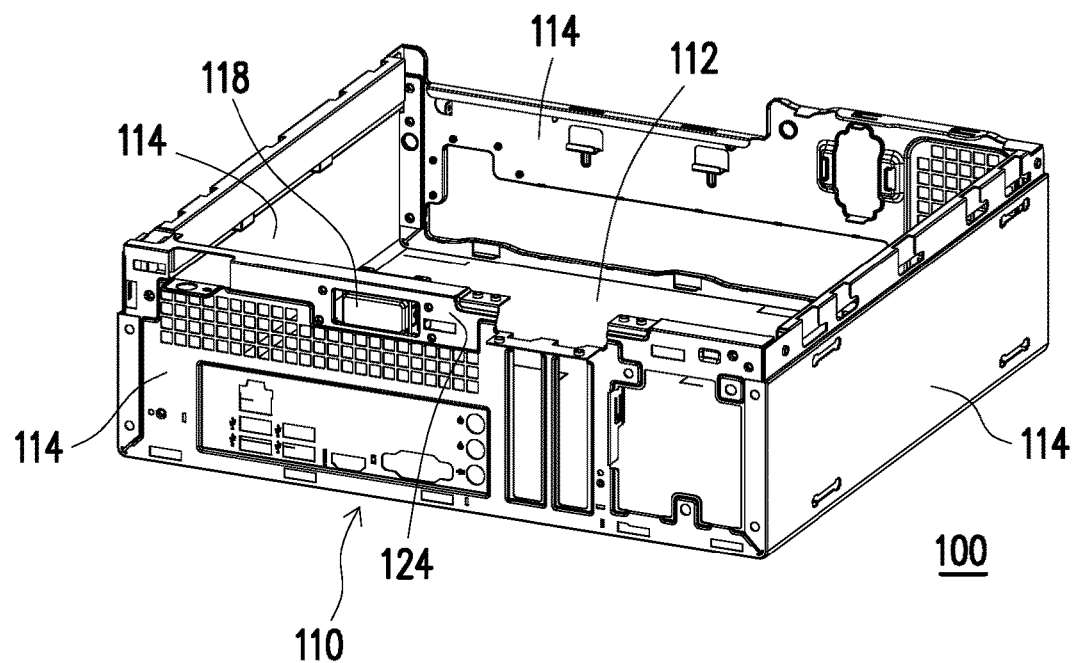
FIG. 2 is a perspective view illustrating a box assembly in FIG. 1.

FIG. 1 is a perspective view illustrating a chassis structure according to an embodiment of the invention. FIG. 2 is a perspective view illustrating a box assembly in FIG. 1. Referring to FIG. 1 and FIG. 2, a chassis structure 100 in the embodiment is, for example, a host chassis of a desktop computer and includes a box assembly 110 and a cover plate 120. The box assembly 110 includes a main plate 112 and a plurality of side plates 114. The side plate 114 is connected to the periphery of the main plate 112, and the cover plate 120 is detachably assembled on the side plate 114.

Figure 3:
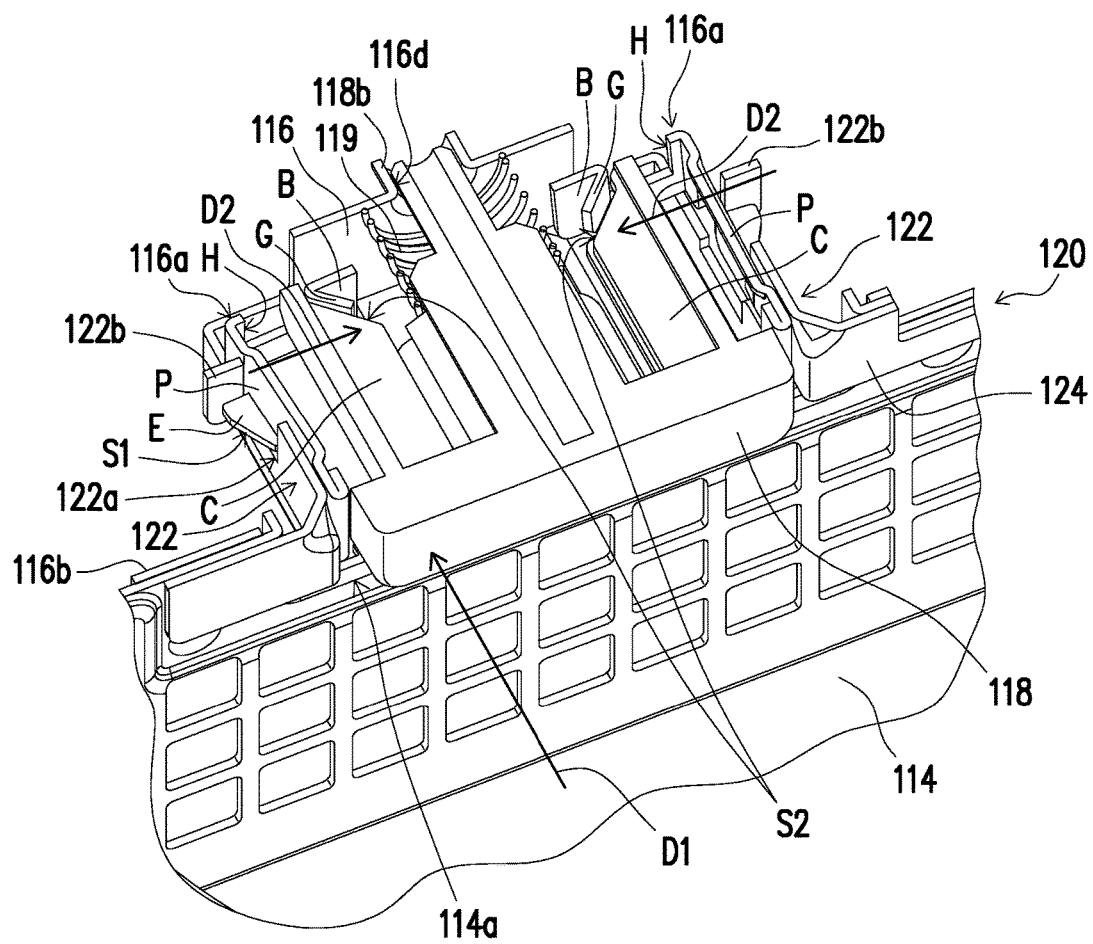
FIG. 3 is a perspective view illustrating a portion of the chassis structure in FIG. 1.
Figure 4:
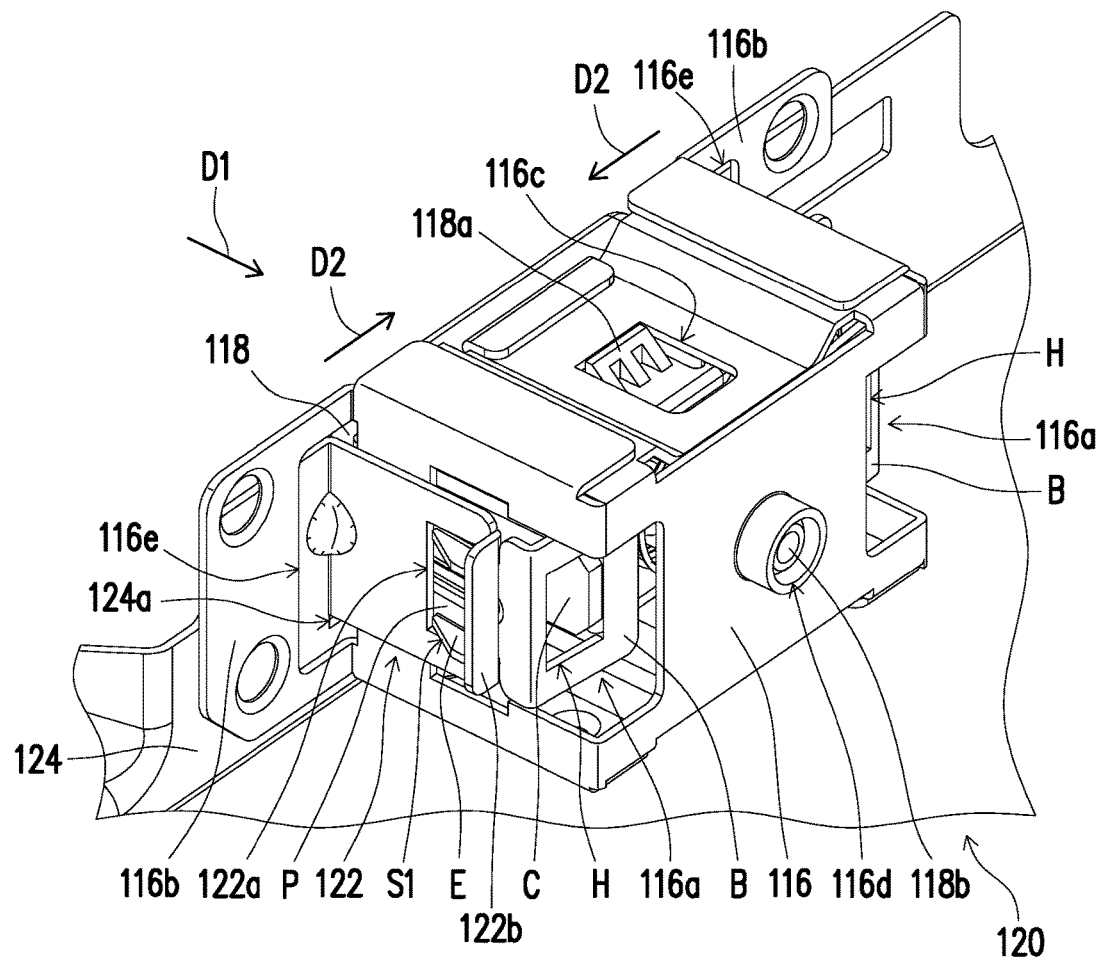
FIG. 4 is a perspective view illustrating a portion of the chassis structure in FIG. 1.
Figure 5:
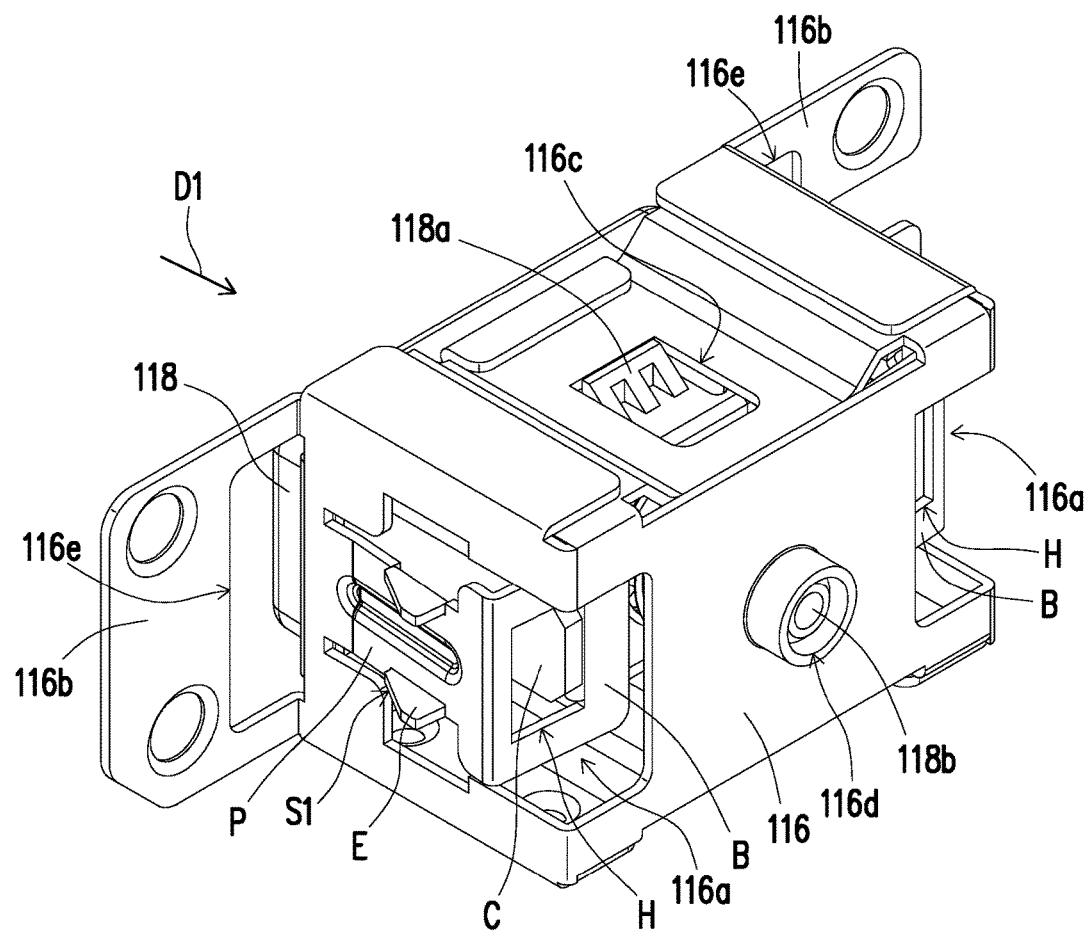
FIG. 5 is a perspective view illustrating a base and a pressing element in FIG. 4.
Figure 6:
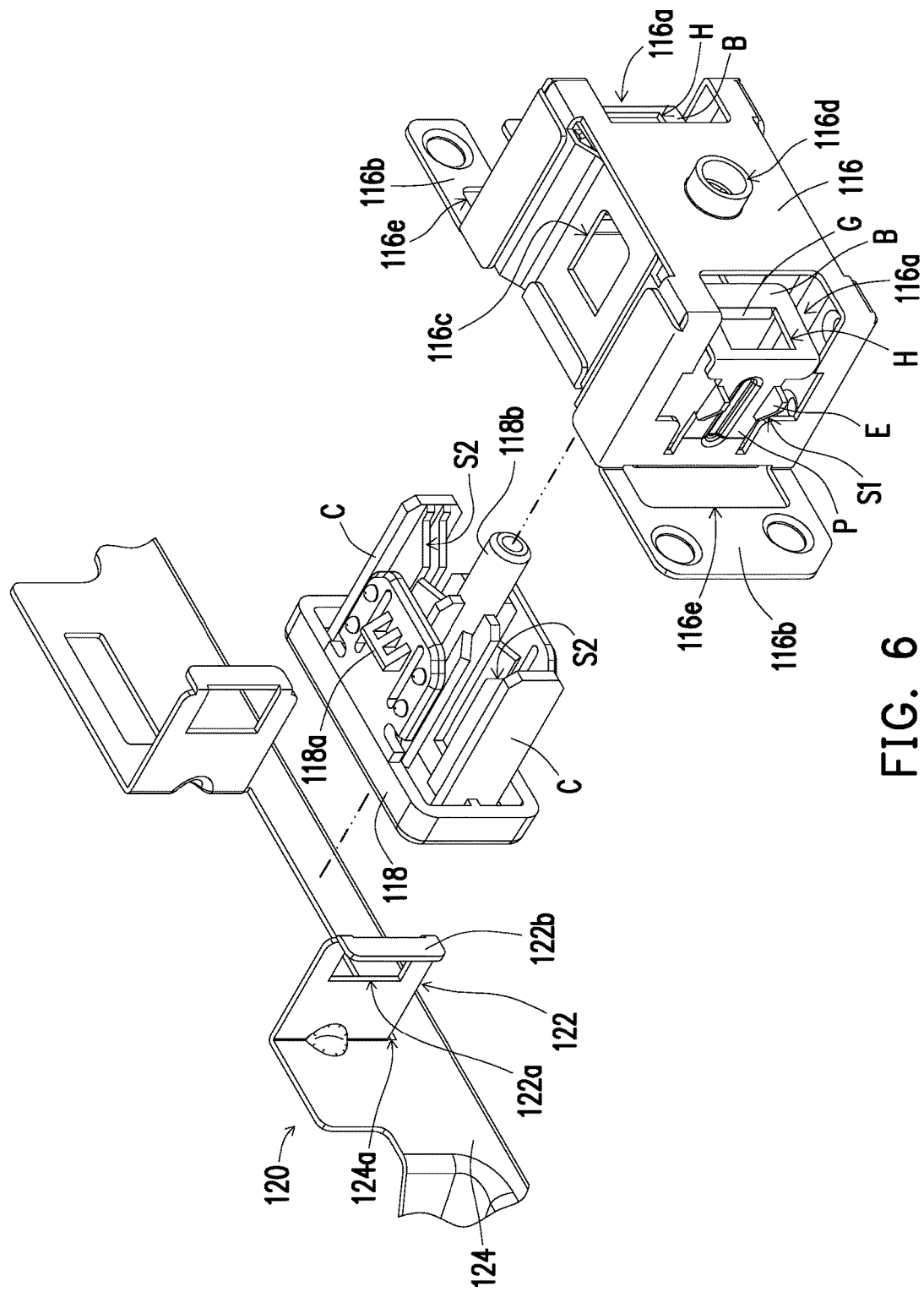
FIG. 6 is an exploded view illustrating a base, a pressing element and a cover plate in FIG. 4.

FIG. 3 is a perspective view illustrating a portion of the chassis structure in FIG. 1. FIG. 4 is a perspective view illustrating a portion of the chassis structure in FIG. 1. FIG. 5 is a perspective view illustrating a base and a pressing element in FIG. 4. FIG. 6 is an exploded view illustrating a base, a pressing element and a cover plate in FIG. 4. Referring to FIG. 3 to FIG. 6, the box assembly 110 in the embodiment further includes a base 116 and a pressing element 118. The base 116 is fixed on the side plate 114 via a fastening portion 116*b*, and the base 116 has a plurality of first locking portions 116*a*. In the embodiment, two first locking portions 116*a* are illustrated for exemplary purpose, which are respectively formed on two opposite sides of the base 116. The pressing element 118 is slidably disposed on the base 116 along an unlocking direction D1. The cover plate 120 has a plurality of second locking portions 112, and the number thereof corresponds to the number of the first locking portion 116*a*. In the embodiment, two second locking portions 122 are shown for exemplary purpose, which are respectively disposed on two opposite sides of the base 116. The two first locking portions 116*a* are respectively locked with the two second locking portions 122. When the pressing element 118 is pressed along the unlocking direction D1, the pressing element 118 drives each of the first locking portions 116*a* to be separated from the corresponding second locking portion 122.

As described above, the base 116 and the pressing element 118 are disposed on the side plate 114, the first locking portion 116*a* of the base 116 is used to be locked with the second locking portion 122 of the cover plate 120, and the locking status of the base 116 and the cover plate 120 is changed by moving the pressing element 118, such that the user can release the cover plate 120 from the base 116 by simply pressing the pressing element 118 with single hand and thus the cover plate 120 can be easily detached.

Referring to FIG. 3 to FIG. 6, specifically, each of the first locking portions 116*a* in the embodiment includes an elastic sheet P, and the elastic sheet P is formed with a protrusion E (two protrusions are shown). Each of the second locking portions 122 is a sheet extended from the cover plate 120 and has a locking hole 122*a*. The protrusion E passes through the locking hole 122*a* to allow the first locking portion 116*a* and the second locking portion 122 to be locked together. Additionally, the terminal end of the sheet includes a bending stopping portion 122*b*, and the stopping portion 122*b* is adaptable to push against the protrusion E, thereby avoiding that the cover plate 120 is slid after being combined. On the other hand, the terminal end of the elastic sheet P has a bending portion B, and the pending portion B is formed with an opening H. The pressing element 118 includes two pillars C corresponding to the two openings H respectively. When the user presses the pressing element 118 along the unlocking direction D1 to make the pressing element 118 to move along the unlocking direction D1, each of the pillars C of the pressing element 118 passes through the opening H and pushes against the inner edge of the opening H, such that the elastic sheet P is elastically deformed along a separating direction D2 perpendicular to the unlocking direction D1, and thus the protrusion E is separated from the locking hole 122*a* along the separating direction D2. At this time, the first locking portion 116*a* and the second locking portion 122 are no longer locked with each other, and the user can detach the cover plate 120 from the box assembly 110.

In the embodiment, each of the protrusions E has a guiding slope S1 and adaptable to pass through the locking hole 122*a* via the guidance of the guiding slope S1. Additionally, each of the pillars C has a pushing slope S2, and a distance between the pushing slope S2 and the second locking portion 122 is reduced gradually along the unlocking direction D1. In the process that the pillar C passes through the opening H along the unlocking direction D1, the inner edge of the opening H is moved along the pushing slope S2 to drive the elastic sheet P to move along the separating direction D2. Moreover, a guiding segment G is extended from the inner edge of each of the openings H, and the guiding segment G guides the pillar C to pass through the opening H.

In the embodiment, the cover plate 120 is, for example, assembled on the side plate 114 along an assembling direction D3 (shown in FIG. 1), and the unlocking direction D1 is, for example, parallel with the assembling direction D3, thereby avoiding that the assembling direction and the unlocking direction of the cover plate 120 are over complicated and makes it difficult for user to operate. For example, the user can press the pressing element 118 along the unlocking direction D1 via the thumb, and then slide the cover plate 120 along the opposite direction of the assembling direction D3 with the rest of four fingers, thereby completing the disassembling operation with single hand, which should not be constructed as a limitation to the invention. In other embodiments, the unlocking direction D1 may not be parallel with the assembling direction D3.

Referring to FIG. 4 and FIG. 6, the edge of the cover plate 120 in the embodiment has a folding wall 124, and the second locking portion 122 is forming on the folding wall 124. The folding wall 124 refers to the side plate folded from the edge of the cover plate 120, and which covers a portion of the external side of the side plate 114. Specifically, the folding wall 124 has a notch 124*a*, and the notch 124*a* corresponds to the base 116. The two second locking portions 122 are respectively connected to the two opposite inner edges of the notch 124*a* and correspond to the two first locking portions 116*a* respectively.

Referring to FIG. 4 to FIG. 6, the base 116 in the embodiment has an opening 116*e*. Each of the second locking portions 122 of the cover plate 120 passes through the opening 116*e* to be locked with the corresponding first locking portion 116*a*.

Referring to FIG. 4 to FIG. 6, the base 116 in the embodiment has a sliding slot 116*c*, the pressing element 118 has a sliding bump 118*a*, and the sliding bump 118*a* is disposed in the sliding slot 116*c*, such that the two opposite terminal ends of the sliding slot 116*c* is utilized to restrict the moving range of the sliding bump 118*a*, thereby preventing the pressing element 118 from being separated from the base 116. Additionally, the base 116 has a sliding hole 116*d*, the pressing element 118 has a sliding pillar 118*b*, and the sliding pillar 118*b* passes through the sliding hole 116*d* along the unlocking direction D1 such that the pressing element 118 is slidably disposed on the base 116.

Figure 7:
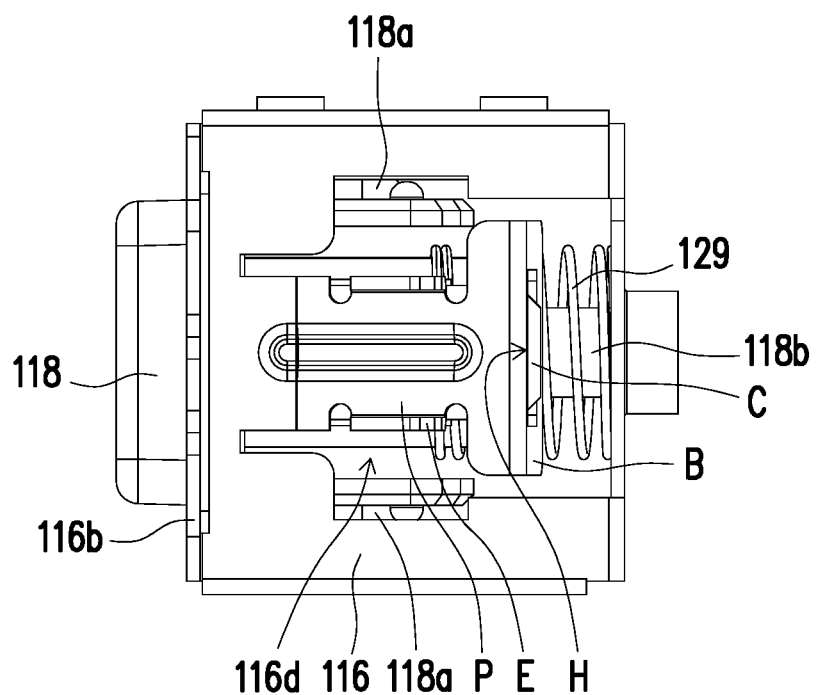
FIG. 7 is a side view illustrating a base and a pressing element in FIG. 5.

FIG. 7 is a side view illustrating a base and a pressing element in FIG. 5. Referring to FIG. 3 and FIG. 7, the box assembly 110 in the embodiment further includes an elastic element 119. The elastic element 119 is, for example, a compressing spring and disposed between the base 116 and the pressing element 118, and sleeved on the sliding pillar 118*b*. The pressing element 118 is adaptable to resist the elastic force of the elastic element 119 and slide relative to the base 116 along the unlocking direction D1, and adaptable to be reset through the elastic force of the elastic element 119. In the embodiment, the pressing element 118 is disposed in an accommodating groove 116f (shown in FIG. 7) of the base 116, such that the pressing element 118 and the base 116 as a whole has a smaller size. As shown in FIG. 7, although one end of the pressing element 118 is protruded from the base 116, in some aspects of the embodiment that are not shown, the pressing element 118 is completely accommodated in the base 116 such that the appearance of the chassis is smoother.

Although the invention has been disclosed by the above embodiments, the embodiments are not intended to limit the invention. It will be apparent to those skilled in the art that various modifications and variations can be made to the structure of the invention without departing from the scope or spirit of the invention. Therefore, the protecting range of the invention falls in the appended claims.

What is claimed is:

1. A chassis structure, comprising:
a box assembly, comprising a plurality of side plates, a base and a pressing element, the base being disposed on one of the plurality of side plates and having a plurality of first locking portions, the pressing element being slidably disposed on the base; and
a cover plate, assembled on the plurality of side plates and having a plurality of second locking portions, wherein the plurality of first locking portions are adaptable to be locked with the plurality of second locking portions,
wherein the plurality of first locking portions comprise elastic sheets, each of the elastic sheets has a first opening, the pressing element comprises a pillar, and the pillar corresponds to the first opening,
wherein a terminal end of each of the elastic sheets has a bending portion, and the first opening is formed on the bending portion.

2. The chassis structure according to claim 1, wherein the plurality of first locking portions comprise two first locking portions, and the two first locking portions are respectively formed on two opposite sides of the base.

3. The chassis structure according to claim 2, wherein the plurality of second locking portions comprise two second locking portions corresponding to the two first locking portions.

4. The chassis structure according to claim 1, wherein the plurality of first locking portions comprise protrusions.

5. The chassis structure according to claim 4, wherein each of the protrusions has a guiding slope.

6. The chassis structure according to claim 4, wherein the plurality of second locking portions comprise sheets, and each of the sheets has a locking hole.

7. The chassis structure according to claim 6, wherein a terminal end of each of the sheets comprises a stopping portion.

8. The chassis structure according to claim 1, wherein the plurality of side plates have a second opening, the base is disposed on an inner side of the at least one side plate and corresponds to the second opening, the at least one second locking portion passes through the second opening from an external side of the at least one side plate to be locked with the at least one first locking portion.

9. The chassis structure according to claim 1, wherein an edge of the cover plate has a folding wall, and the plurality of second locking portions are formed on the folding wall.

10. The chassis structure according to claim 9, wherein the folding wall has a notch, and the plurality of second locking portions are connected to an inner edge of the notch.

11. The chassis structure according to claim 1, wherein the pillar has a pushing slope, in a process that the pillar passes through the first opening, an inner edge of the first opening is moved along the pushing slope.

12. The chassis structure according to claim 1, wherein the pressing element is adaptable to move along an unlocking direction to drive the first locking portions to be separated from the second locking portions.

13. The chassis structure according to claim 1, wherein the base has a plurality of sliding slots, the pressing element has a plurality of sliding bumps, and the plurality of sliding bumps are disposed in the plurality of sliding slots.

14. The chassis structure according to claim 1, wherein the box assembly comprises an elastic element, the elastic element is disposed between the base and the pressing element.

15. The chassis structure according to claim 14, wherein the base has a sliding hole, the pressing element has a sliding pillar, the sliding pillar passes through the sliding hole, and the elastic element is sleeved on the sliding pillar.

16. The chassis structure according to claim 1, wherein the pressing element is completely accommodated in the base.

17. A chassis structure, comprising:
a box assembly, comprising a plurality of side plates, a base and a pressing element, the base being disposed on one of the plurality of side plates and having a plurality of first locking portions, the pressing element being slidably disposed on the base; and
a cover plate, assembled on the plurality of side plates and having a plurality of second locking portions, wherein the plurality of first locking portions are adaptable to be locked with the plurality of second locking portions,
wherein the plurality of first locking portions comprise elastic sheets, each of the elastic sheets has an opening, the pressing element comprises a pillar, and the pillar corresponds to the opening,
wherein a guiding segment is extended from an inner edge of the opening, and the guiding segment guides the pillar to pass through the opening.

* * * * *